United States Patent
Herzel et al.

(10) Patent No.: US 6,861,913 B1
(45) Date of Patent: Mar. 1, 2005

(54) VOLTAGE-CONTROLLED OSCILLATOR WITH LC RESONANT CIRCUIT

(75) Inventors: Frank Herzel, Frankfurt (DE); Peter Weger, Frankfurt (DE)

(73) Assignee: IHP GmbH - Innovations for High Performance Microelectronics, Frankfurt (DE)

( * ) Notice: Subject to any disclaimer, the term of this patent is extended or adjusted under 35 U.S.C. 154(b) by 0 days.

(21) Appl. No.: 09/980,892

(22) PCT Filed: Apr. 26, 2000

(86) PCT No.: PCT/DE00/01385

§ 371 (c)(1),
(2), (4) Date: Dec. 3, 2001

(87) PCT Pub. No.: WO00/76057

PCT Pub. Date: Dec. 14, 2000

(30) Foreign Application Priority Data

Jun. 5, 1999 (DE) .......................................... 199 25 742
Apr. 26, 2000 (DE) .......................................... 100 21 273

(51) Int. Cl.[7] .............................. H03J 5/24; H03B 1/04
(52) U.S. Cl. ................................ 331/117 R; 331/36 L; 331/167; 331/179; 331/181; 331/10
(58) Field of Search ............................ 331/181, 117 R, 331/167, 36 L, 179, 10, 117 FE; 375/376; 332/127, 128

(56) References Cited

U.S. PATENT DOCUMENTS 5,036,294 A 7/1991 McCaslin
5,808,531 A 9/1998 Nakano
5,872,489 A 2/1999 Chang et al.
6,124,766 A * 9/2000 Matsuura .................... 329/306

FOREIGN PATENT DOCUMENTS

| DE | 290 525 A5 | 10/1983 |
|---|---|---|
| DE | 43 31 499 A1 | 3/1995 |
| DE | 195 46 928 A1 | 6/1997 |
| EP | 0 911 960 A1 | 4/1999 |
| JP | 09321538 A | 12/1997 |

* cited by examiner

*Primary Examiner*—Arnold Kinkead
(74) *Attorney, Agent, or Firm*—Hahn Loeser + Parks LLP; Stephen L. Grant (57) ABSTRACT

A voltage-controlled oscillator device with an LC-resonant circuit, in particular for implementing integrated voltage-controlled oscillators for the lower GHz range, is disclosed. The device achieves continuous frequency tunability in a wide range in particular with a low level of phase noise and phase jitter. In the voltage-controlled oscillator, a second inductor can be periodically switched in parallel and/or in series with at least one first inductor of the LC-resonant circuit by way of a switching means actuated with the oscillator frequency. A control input of the switching means is connected to a variable dc voltage. In that respect the relationship of the duration of the conducting state and the duration of the non-conducting state of the switching means is variable within an oscillation period of the oscillator in dependence on the value of the control voltage. In accordance with the relationship of the duration of the conducting state and the duration of the non-conducting state of the switching means within an oscillation period of the oscillator the time-averaged effective inductance is variable in dependence on the value of the control voltage.

35 Claims, 7 Drawing Sheets

VOLTAGE-CONTROLLED OSCILLATOR WITH LC RESONANT CIRCUIT

The invention concerns a voltage-controlled oscillator with an LC-resonant circuit, in particular for implementing integrated voltage-controlled oscillators for the lower GHz range.

BACKGROUND OF THE ART

Integrated circuits involve using voltage-controlled oscillators which are mostly in the form of ring oscillators or LC-oscillators. Ring oscillators are distinguished by a high degree of frequency tunability. That advantage however is impaired by a strong phase noise and a severe phase jitter. In the case of LC-oscillators frequency tunability is predominantly implemented by means of variable capacitors, for example capacitor diodes. Those oscillators admittedly involve a lower level of phase noise and a lesser degree of phase jitter, but frequency tunability is in most cases seriously reduced.

Japanese patent application 093 215 38 A describes a voltage-controlled LC-oscillator circuit in which a part of the inductance is short-circuited by means of a switching transistor for given periods of time, whereby the inductive component is reduced at times in such a way that alternate operation of the frequency in two frequency bands is possible.

Apart from the switching operation which is substantially slower than the period duration in the desired frequency range, such an arrangement does not permit continuous tuning of the frequency in a wide frequency range.

A similar principle is also described in: A. Kral et al "RF-CMOS-Oscillators with Switched Tuning", Custom Integrated Circuits Conference (CICC'98), pp. 555–558. In the case of a fully integrated CMOS-oscillator for a frequency range of between 1 and 2 GHz a tuning range of about 26% is achieved by switching between a plurality of discrete inductance values.

Besides the use of switching elements which adversely influence phase noise and phase jitter, that arrangement is seen to suffer from the disadvantage that, in spite of the circuit being of a high degree of complexity, it was only possible to achieve a relatively limited frequency tuning range. In addition the switching of discrete inductance values means that it is only possible to achieve quasi-continuous frequency tuning which has to be supplemented by capacitive tuning.

In integrated radio systems the oscillator must enjoy a relatively great tuning range in order to compensate for technology and temperature fluctuations and to cover the receiving and transmitting band respectively.

With operating voltages in modern technologies becoming smaller and smaller the available voltage range for the control voltage of the voltage-controlled oscillator (VCO) is becoming progressively smaller. That means that the necessary sensitivity of the oscillation frequency of the oscillator in relation to control voltage variations increases. The consequence of this is that, upon integration of the VCO into a phase-locked loop (PLL) the noise of the control voltage causes severe phase noise. That problem is becoming more acute with down-scaling of the technology, which goes hand-in-hand with the reduction in the supply voltage.

Therefore the object of the invention is to propose a voltage-controlled oscillator with an LC-resonant circuit, with which the disadvantages of the state of the art are overcome and with which continuous frequency tunability in a wide range can be achieved in particular with a low level of phase noise and a low level of phase jitter.

SUMMARY OF THE INVENTION

In accordance with the invention that object is attained in that, in a voltage-controlled oscillator with an LC-resonant circuit there can be periodically switched in parallel and/or in series with at least one inductor a further inductor by way of a switching means actuated with the oscillator frequency and that a control input of the switching means is connected to a variable dc voltage. Advantageously a further inductor can be periodically switched in parallel and/or series with a plurality of inductors by way of a respective controllable switching means. The controllable switching means are periodically in a conducting state and then a non-conducting state. They are controllable by a variable control voltage. In that respect the relationship of the duration of the conducting state and the duration of the non-conducting state of the switching means is variable within an oscillation period of the oscillator in dependence on the value of the control voltage. In accordance with the relationship of the duration of the conducting state and the duration of the non-conducting state of the switching means within an oscillation period of the oscillator the time-averaged effective inductance is variable in dependence on the value of the control voltage. The controllable switching means are advantageously switching transistors and in particular MOS-FETs whose gate terminals are connected to the input of the control voltage and whose source terminals are connected to parts of the circuit arrangement carrying the oscillator frequency. Advantageously the oscillator is constructed using a CMOS or bipolar technology and can preferably be used in frequency synthesizers for wide-band systems and for multi-band uses and for clock generation and clock recovery in high-speed circuits such as for example microprocessors and memories.

The teaching of the invention involves replacing the coils in a resonant circuit by pairs of coils which are connected in parallel and/or in series and of which a respective one of the coils is connected to a switch which is periodically opened and closed. That means that in each case only one coil or the parallel and/or series connection of both coils is operative. The period of time during which the switch is closed within an oscillation period is controlled by a control voltage. The time-averaged effective inductance can thus be altered in a wide range. This results in the desired continuous frequency tunability.

BRIEF DESCRIPTION OF THE DRAWINGS the features of the invention, besides being set forth in the claims, are also to be found in the description and the drawings, in which respect the individual features each on their own or in pluralities in the form of sub-combinations represent patentable configurations in respect of which protection is claimed herein. Embodiments by way of example of the invention are described in greater detail hereinafter. In the accompanying drawings:

DETAILED DESCRIPTION OF THE PREFERRED EMBODIMENT

EXAMPLE 1

Figure 1:
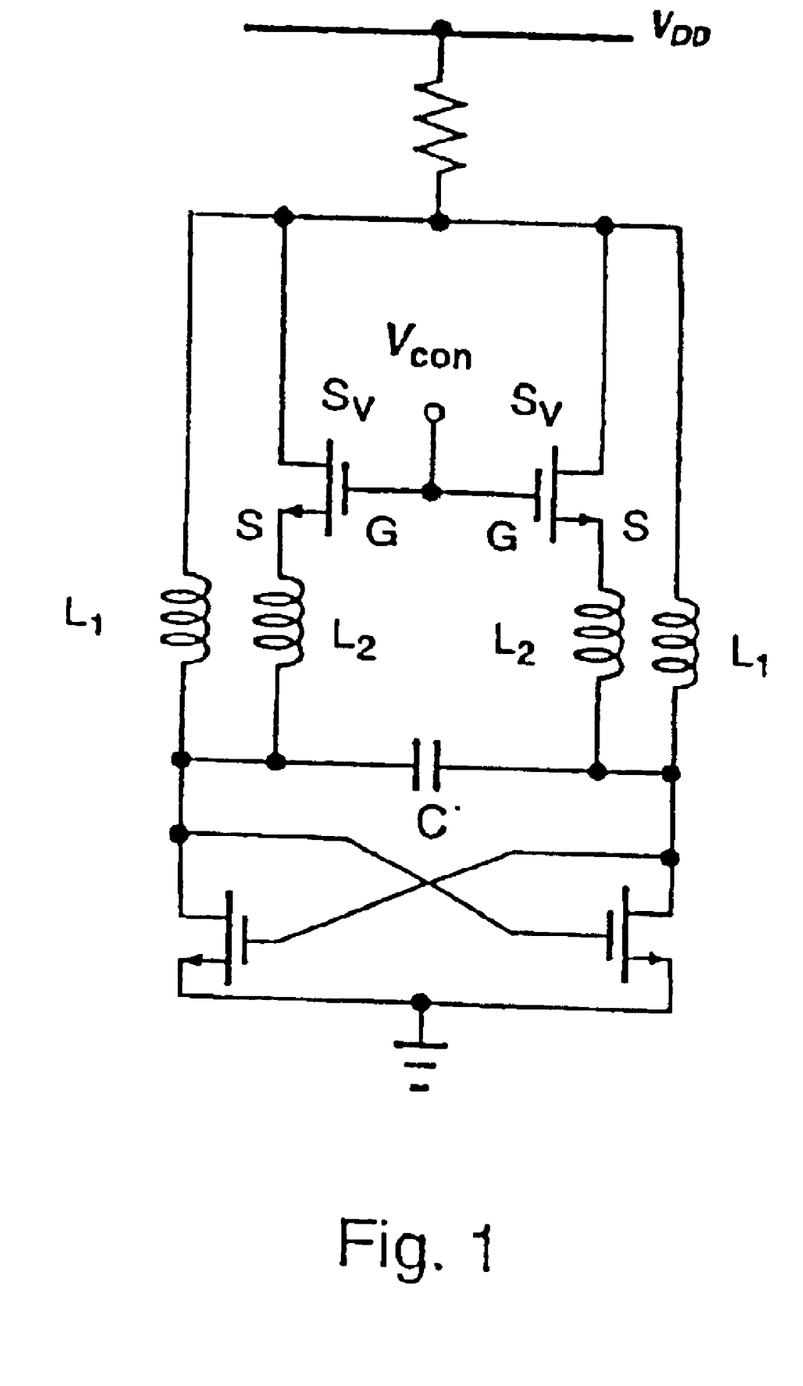
FIG. 1 shows a voltage-controlled oscillator according to the invention.

FIG. 1 shows an LC-oscillator according to the invention with two cooperating semiconductor switches and a capacitor C. The inductors $L_1$ are arranged in two branches. Associated with each of the two inductors $L_1$ is a respective further inductor $L_2$ which can be switched in parallel with the first inductors $L_1$ by way of a respective switching means $S_v$. The gate terminals G of the switching means $S_v$, which are in the form of MOSFETs are connected to an input $V_{con}$ for a control voltage $U_{con}$ while the source terminals S are connected to the output of the oscillator, which carries the oscillator frequency.

Figure 2:
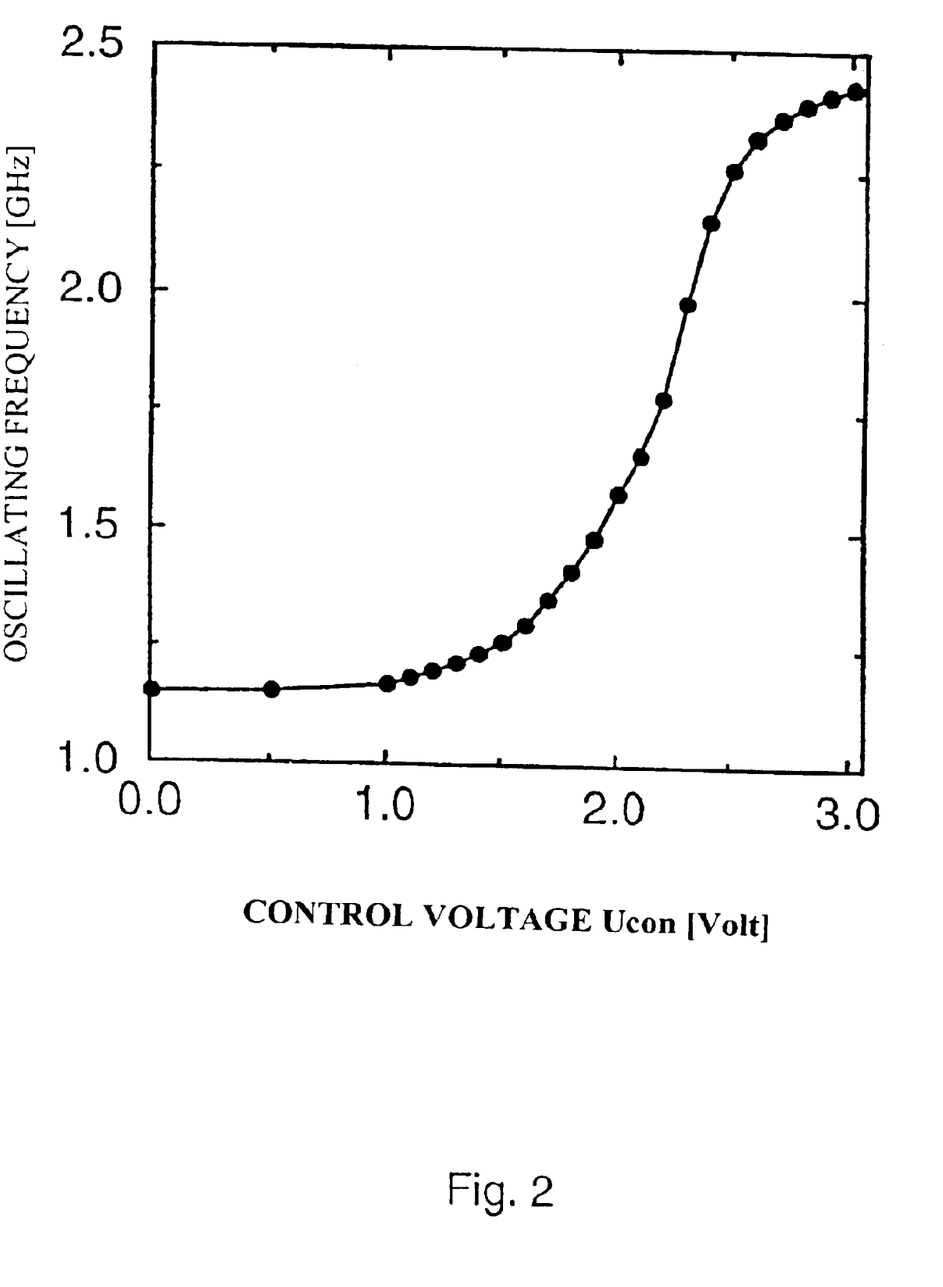
FIG. 2 shows a diagram of the oscillator frequency as a function of the control voltage.

FIG. 2 shows a diagram in respect of the oscillator frequency in GHz as a function of the control voltage $U_{con}$.

The mode of operation of the oscillator according to the invention is as follows: the two switching means $S_v$ in this embodiment being two MOSFETs, are opened at a low control voltage $U_{con}$ during the major part of an oscillation period of the oscillator. That state occurs as long as the gate-source voltage does not exceed the switching point of the switching means $S_v$. During the duration of the non-conducting state of the switching means $S_v$ only the first inductors $L_1$ are effective. For a small part of the oscillation period the gate-source voltage exceeds the switching point of the switching means $S_v$. For the duration of the now conducting state of the switching means $S_v$ the further inductors $L_2$ are connected in parallel with the first inductors $L_1$ whereby the total value of the effective inductance reduces as a function of time. In accordance with the relationship of the longer duration of the non-conducting state of the switching means $S_v$ to the shorter duration of the conducting state thereof, there is a relatively great, time-averaged effective inductance. The oscillator frequency resulting therefrom is correspondingly low.

With an increased control voltage $U_{con}$ the two switching means $S_v$ are opened only during a smaller part of the oscillation period and are closed during the major part thereof. In accordance with the relationship of the shorter duration of the non-conducting state of the switching means $S_v$ to the longer duration of the conducting state thereof there is therefore a relatively low, time-averaged effective inductance. The oscillator frequency resulting therefrom is correspondingly high.

As a special case it will be assumed that the inductance and quality of the pairs of coils $L_1$ and $L_2$ are identical and involve the same magnitudes L1 and Q1. For the situation involving ideal switching means $S_v$ the following then apply in regard to the inductance L and the quality Q of the overall arrangement comprising $L_1$, $L_2$ and the switch:

L=L1, Q=Q1 when the switching means $S_v$ are opened, and

L=L1/2, Q=Q1 when the switching means $S_v$ are closed.

Closure of the switching means $S_v$ therefore causes halving of the inductance which is crucial in terms of the oscillator frequency. The quality of the pairs of coils $L_1$ and $L_2$ is equal to the quality of the individual coil. If it is considered that the following approximately applies for the oscillator frequency:

$$f_o 1 = 1/\sqrt{L},$$

the following relationship is found for the lower limit frequency $f_o$,min and for the upper limit frequency $f_o$,max for the frequency tuning range:

$$f_o\text{,max} = \sqrt{2} \cdot f_o\text{,min}$$

The following similarly applies for the general case of coils which are not necessarily the same:

$$f_o\text{,max} = \sqrt{(1+L1/L2)} \cdot f_o\text{,min}$$

Thus the frequency tuning range can still be further increased by the choice of a greater ratio of L1/L2.

FIG. 2 shows the simulated frequency tuning range in the form of a diagram showing the oscillator frequency $f_o$ as a function of the control voltage $U_{con}$ for L1/L2=2. In this embodiment the frequency tuning range is about 1.25 GHz, that is to say more than an octave.

The oscillator according to the invention can be implemented in a fully integrated configuration both using CMOS technology and also bipolar technology. It can advantageously be used in frequency synthesizers for wide-band systems and for multi-band uses and for clock production and clock recovery in high-speed circuits such as microprocessors and memories.

EXAMPLE 2

Figure 3:
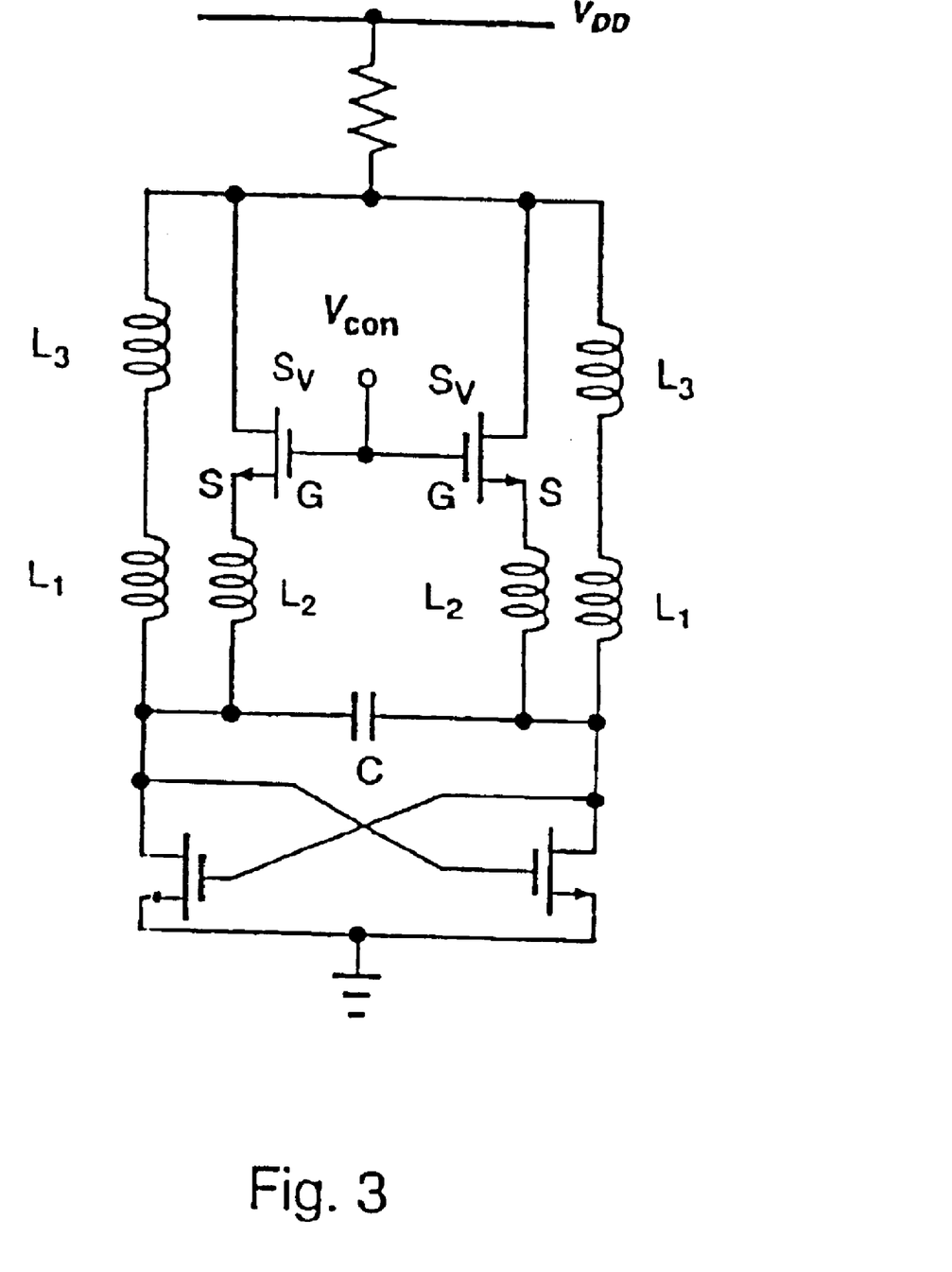
FIG. 3 shows a further embodiment of the oscillator according to the invention.

As a further embodiment by way of example FIG. 3 shows a circuit arrangement of the oscillator according to the invention with two respective first inductors $L_1$, $L_3$, in relation to each of which a further respective inductor $L_2$ can be connected in parallel.

The frequency tuning range can be increased by the use of more than two inductors $L_1$, $L_2$, as demonstrated in FIG. 3.

EXAMPLE 3

Figure 4:
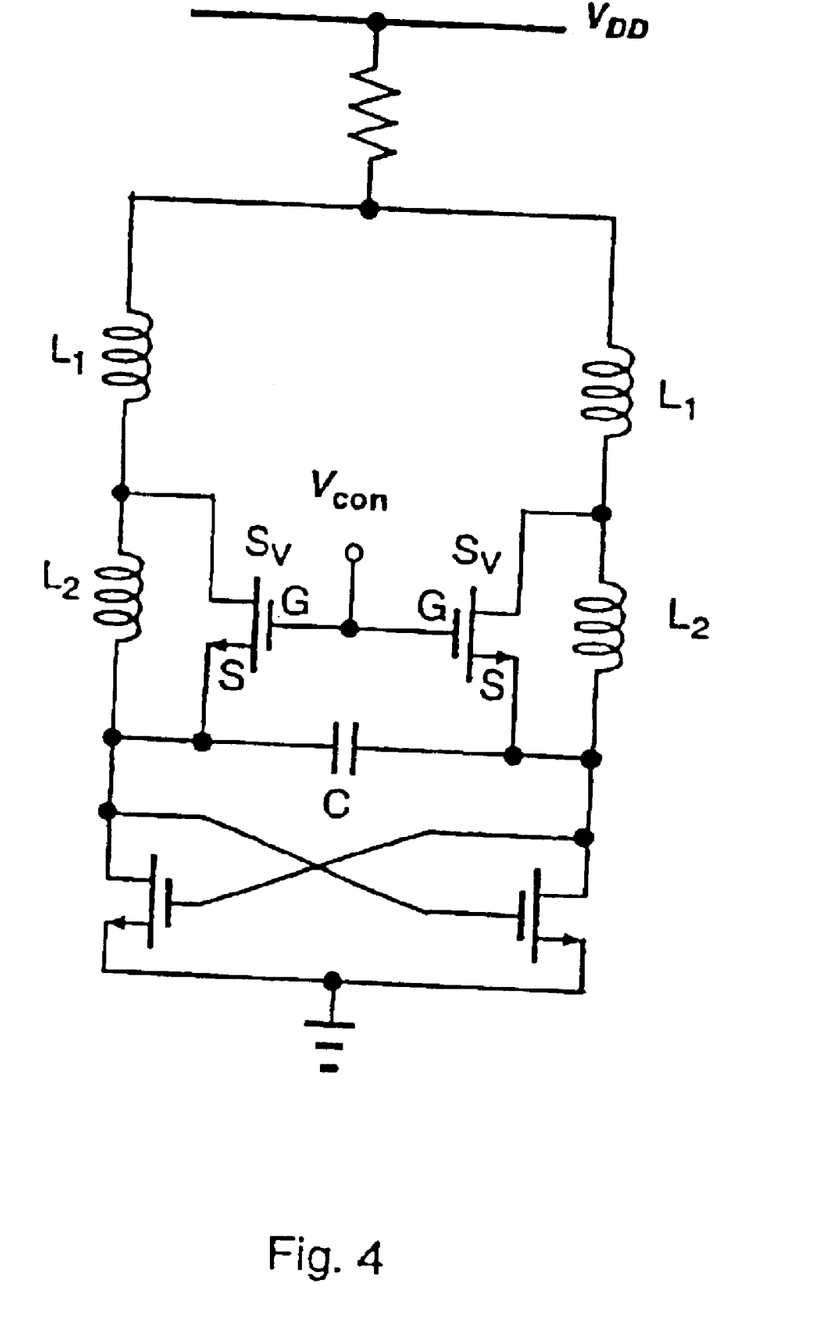
FIG. 4 shows a voltage-controlled oscillator according to the invention.

FIG. 4 shows an LC-oscillator according to the invention with two co-operating semiconductor switches and a capacitor C. The inductors $L_1$ are arranged in two branches. Associated with each of the two inductors $L_1$ is a respective further inductor $L_2$ which can be connected in series with the first inductors $L_1$ by a respective switching means $S_v$. The gate terminals G of the switching means $S_v$ which are in the form of MOSFETs are connected to an input $V_{con}$ for a control voltage $U_{con}$ while the source terminals S are connected to the output of the oscillator, which carries the oscillator frequency.

When the switching means $S_v$ is closed the total inductance is of a lower value than when the switching means $S_v$ is opened. The switching means $S_v$ is modulated at the oscillation frequency.

The mode of operation of the oscillator according to the invention is as follows: the two switching means $S_v$, in this embodiment being two MOSFETs, are opened with a low voltage $U_{con}$ at the input $V_{con}$ during the major part of an oscillation period of the oscillator. That state occurs as long as the gate-source voltage does not exceed the switching point of the switching means $S_v$. During the duration of the non-conducting state of the switching means $S_v$ the further inductors $L_2$ are effective, in relation to the first inductors $L_1$, whereby the total value of the effective inductance is increased. For a small part of the oscillation period the gate-source voltage exceeds the switching point of the switching means $S_v$. Only the first inductors $L_1$ are effective for the duration of the now conducting state of the switching means $S_v$. In accordance with the relationship of the longer duration of the non-conducting state of the switching means $S_v$ to the shorter duration of the conducting state thereof, there is a relatively high, time-averaged effective inductance. The oscillator frequency resulting therefrom is correspondingly low.

With an increased control voltage $U_{con}$ the two switching means $S_v$ are only opened during a smaller part of the oscillation period and closed during the greater part thereof. In accordance with the relationship of the shorter duration of the non-conducting state of the switching means $S_v$ to the longer duration of the conducting state thereof, there is a relatively low, time-averaged effective inductance. The oscillator frequency resulting therefrom is correspondingly higher than with a lower control voltage $U_{con}$.

EXAMPLE 4

Figure 5:
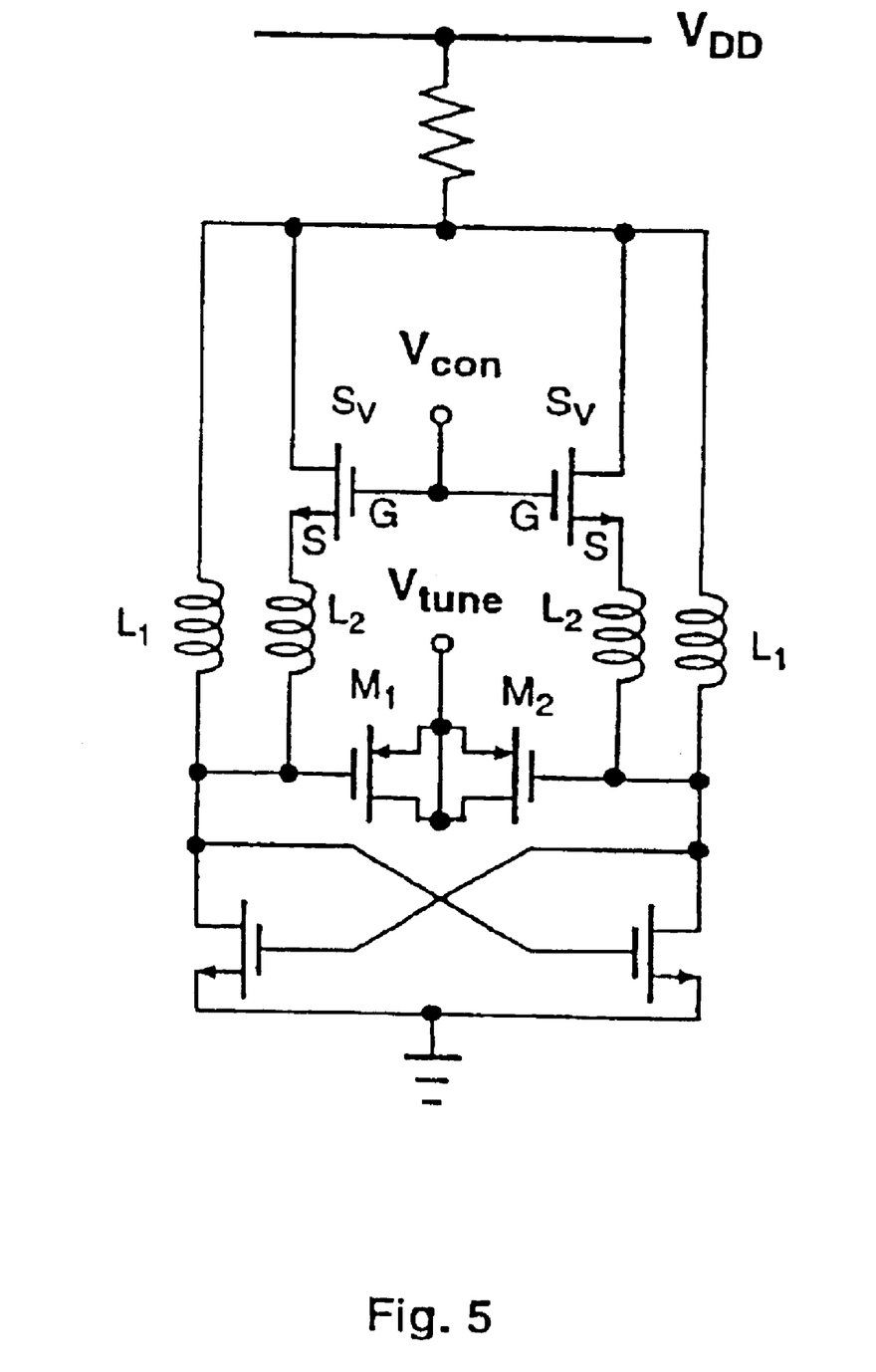
FIG. 5 shows a further embodiment by way of example of the oscillator according to the invention.

FIG. 5 shows a combination of inductive and capacitive tuning. Besides inductive tuning, capacitive tuning is also possible.

Inductive tuning is based on the principle described in the preceding embodiments. In this embodiment the inductors $L_1$ and $L_2$ are connected in parallel. The two switching means $S_v$ are opened at a low control voltage $U_{con}$ at the input $V_{con}$ during the major part of an oscillation period of the oscillator. That state occurs as long as the gate-source voltage does not exceed the switching point of the switching means $S_v$. During the duration of the non-conducting state of the switching means $S_v$ only the first inductors L1 are effective. For a small part of the oscillation period the gate-source voltage exceeds the switching point of the switching means $S_v$. For the duration of the now conducting state of the switching means $S_v$ the further inductors L2 are connected in parallel with the first inductors L1 whereby the total value of the effective inductance decreases as a function of time. In accordance with the relationship of the longer duration of the non-conducting state of the switching means $S_v$ to the shorter duration of the conducting state thereof there is a relatively high time-averaged effective inductance. The oscillator frequency resulting therefrom is correspondingly low.

With an increased control voltage $U_{con}$ the two switching means $S_v$ are opened only during a smaller part of the oscillation period and are closed during the major part thereof. In accordance with the relationship of the shorter duration of the non-conducting state of the switching means $S_v$ to the longer duration of the conducting state thereof there is a relatively low, time-averaged effective inductance. The oscillator frequency resulting therefrom is correspondingly high.

Figure 6:
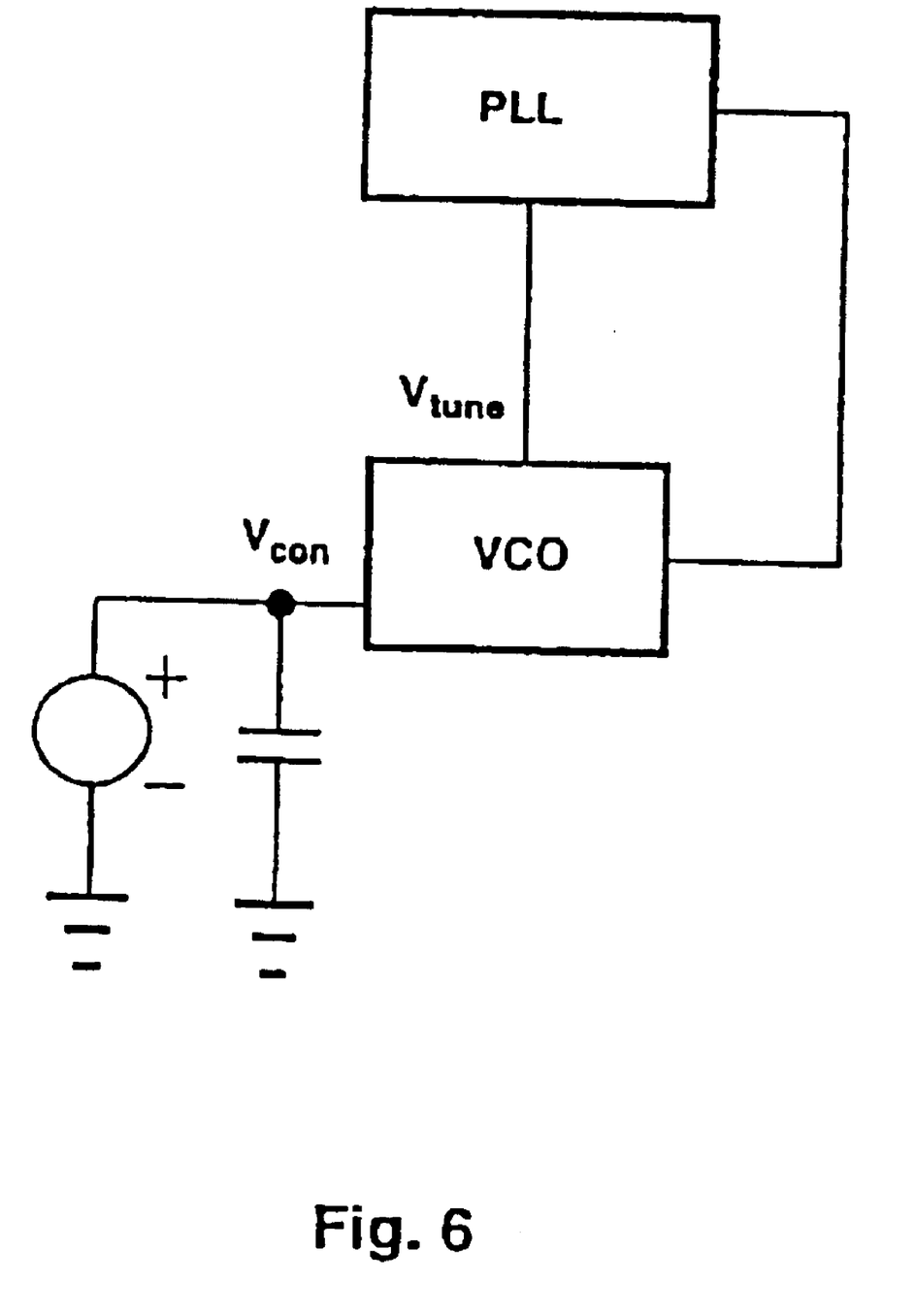
FIG. 6 shows a combination circuit of a VCO with a PLL.

To provide for capacitive tuning integrated in the resonant circuit is a variable capacitance which in this embodiment is embodied by means of two p-MOSFETs $M_1$, $M_2$ in the form of variable capacitor diodes. The control input $V_{con}$ permits tuning of the frequency on the basis of the principle described in the preceding embodiments while a tuning voltage $U_{tune}$ at the tuning input $V_{tune}$ determines the oscillation frequency by way of the time-averaged capacitance. It is now possible to use the control input $V_{con}$ in order to compensate for technology fluctuations while the tuning input $V_{tune}$ is used for fine tuning by means of a phase-locked loop PLL, as shown in FIG. 6. In this case, the tuning input $V_{tune}$ of the VCO is connected to the output of the phase-locked loop PLL and the oscillator output of the voltage-controlled oscillator VCO is connected to the input of the phase-locked loop PLL.

In this case it is possible to use a relatively low VCO-gain $K=df_o/dU_{tune}$. In that way the effect of noise within the phase-locked loop PLL on the phase noise of the voltage-controlled oscillator VCO is minimized. The noise of the inductive control voltage at the control input $V_{con}$ can be blocked by means of a large capacitance.

EXAMPLE 5

Figure 7:
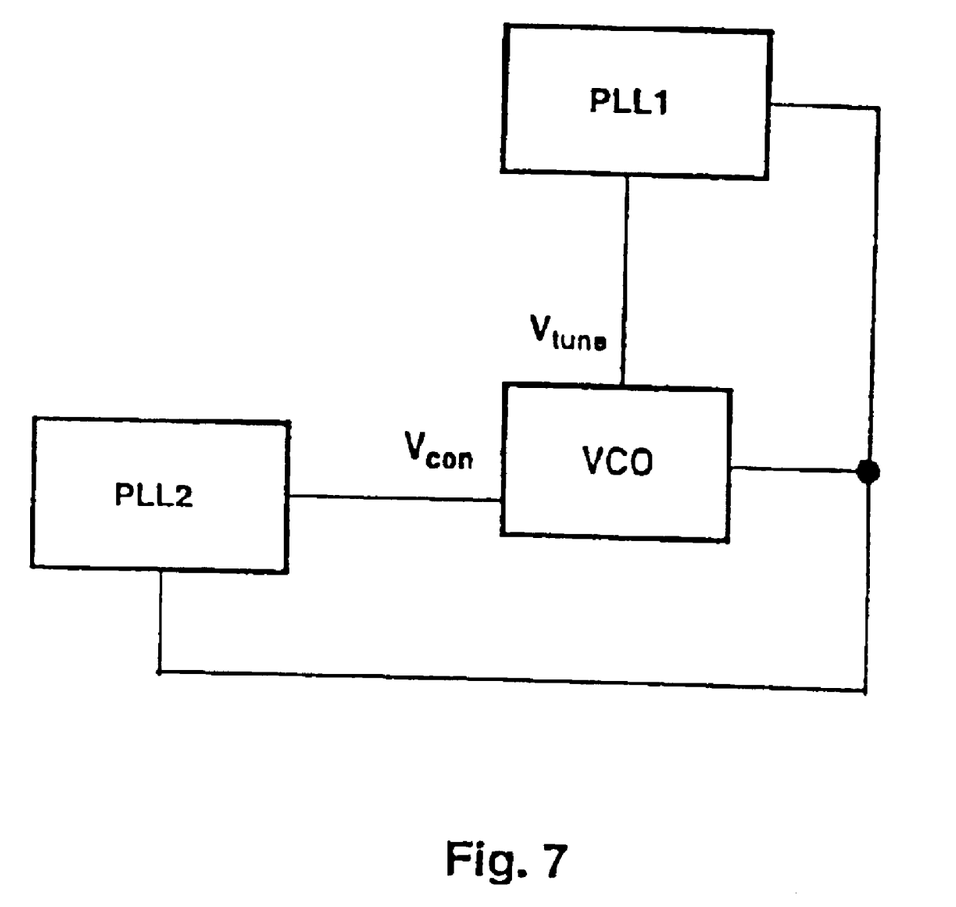
FIG. 7 shows a combination circuit of a VCO with two PLLs.

A modified variant is illustrated in FIG. 7. There, the oscillator output is connected to the inputs of two phase-locked loops PLL1 and PLL2. The tuning input $V_{tune}$ of the voltage-controlled oscillator VCO is connected to the output of the phase-locked loop PLL1 while the control input $V_{con}$ of the voltage-controlled oscillator VCO is connected to the output of the phase-locked loop PLL2.

The phase-locked loop PLL2 serves to compensate for technology and temperature fluctuations while the phase-locked loop PLL1 serves for fine tuning of the oscillation frequency.

This method is particularly suitable for a modulation method which is referred to as frequency hopping. This is a special code division multiple access method (CDMA) in which the transmitting and receiving frequency are altered in respect of time in accordance with a predetermined code. This can be implemented by means of the phase-locked loop PLL1 while the very slow phase-locked loop PLL2 provides for coarse setting of the frequency.

A use of the invention is the "Bluetooth" standard for wireless communication over short distances. The frequency hopping method is used there. The demands in terms of phase noise are not too high there, which makes an integrated CMOS-solution a possibility.

A voltage-controlled oscillator with an LC-resonant circuit was described in the foregoing description by means of specific embodiments. It should be noted however that the present invention is not limited to the details of the described in the specific embodiments as modifications and alterations are claimed within the scope of the claims.

What is claimed is:

1. A voltage-controlled oscillator oscillating at a controllable oscillator frequency comprising:
    an LC-resonant circuit with at least one first inductor;
    at least one controllable switching device, connected to said LC-resonant circuit to periodically take on a conducting and a non-conducting state at the oscillator frequency; and
    at least one second inductor which can be periodically switched in parallel or in series connection with said at least one first inductor of the LC-resonant circuit by way of the at least one controllable switching device actuated at the oscillator frequency;
    wherein the at least one controllable switching device has a control input for controlling, by means of a control voltage, a portion of an oscillation period of the LC-resonant circuit during which portion the second inductor is connected to said LC-resonant circuit.

2. The voltage-controlled oscillator of claim 1, wherein: the at least one second inductor is arranged to be periodically switchably connected to the LC-resonant circuit in parallel to said at least one said first inductor.

3. The voltage-controlled oscillator of claim 2, wherein: the time-averaged effective inductance varies, depending on the control voltage according to the relationship of the duration of the conducting state and the duration of the non-conducting state of the switching means within an oscillation period of the oscillator.

4. The voltage-controlled oscillator of claim 2, wherein: the at least one controllable switching device comprises switching transistors.

5. The voltage-controlled oscillator of claim 4, wherein: the switching transistors are MOSFETs.

6. The voltage-controlled oscillator of claim 5, wherein: the MOSFETs have gate terminals that are connected to the control input of the control voltage.

7. The voltage-controlled oscillator of claim 6, wherein: the MOSFETs have source terminals that are connected to parts of a circuit arrangement carrying the oscillator frequency.

8. The voltage-controlled oscillator of claim 7, wherein: the voltage controlled oscillator is of a CMOS or bipolar technology.

9. The voltage-controlled oscillator of claim 1, wherein: the relationship of the duration of the conducting state and the duration of the non-conducting state of the at least one controllable switching device within an oscillation period of the oscillator varies, depending on the control voltage.

10. The voltage-controlled oscillator of claim 1, wherein: the at least one controllable switching device comprises switching transistors.

11. The voltage-controlled oscillator of claim 10, wherein:
the switching transistors are MOSFETs.

12. The voltage-controlled oscillator of claim 11, wherein:
the MOSFETs have gate terminals that are connected to the control input of the control voltage.

13. The voltage-controlled oscillator of claim 12, wherein:
the MOSFETs have gate terminals that are connected to parts of a circuit arrangement carrying the oscillator frequency.

14. The voltage-controlled oscillator of claim 1, wherein:
the oscillator is of a CMOS or bipolar technology.

15. The voltage-controlled oscillator of claim 1, wherein:
the oscillator is used in frequency synthesizers for wideband systems and for multi-band uses and for clock production and clock recovery in high-speed circuits such as for example microprocessors and memories.

16. The voltage-controlled oscillator of claim 1, wherein:
a voltage-controlled capacitance is integrated in the oscillator, which is connected to a tuning voltage by way of a further control input, a tuning input.

17. The voltage-controlled oscillator of claim 16, wherein:
the voltage-controlled capacitance is embodied by means of at least one variable capacitor diode, wherein an effective capacitance depends on the tuning voltage at the tuning input.

18. The voltage-controlled oscillator of claim 16, wherein:
the tuning input of the oscillator is connected to an output of a phase-locked loop and the output of the voltage-controlled oscillator is connected to an input of the phase-locked loop.

19. The voltage-controlled oscillator of claim 16, wherein:
the tuning input of the voltage-controlled oscillator is connected to the output of a phase-locked loop and the control input of the voltage-controlled oscillator is connected to an output of a further phase-locked loop.

20. The voltage-controlled oscillator of claim 16, wherein:
the voltage-controlled capacitance is embodied by means of at least one variable capacitor diode, wherein an effective capacitance depends on the tuning voltage at the tuning input.

21. The voltage-controlled oscillator of claim 20, wherein:
the tuning input of the voltage controlled oscillator is connected to an output of a phase-locked loop and the output of the voltage controlled oscillator is connected to an input of the phase-locked loop.

22. The voltage-controlled oscillator of claim 1, wherein:
the noise of the control voltage at the control input is blocked out by means of a high capacitance between the control input and ground.

23. The voltage-controlled oscillator of claim 1, wherein:
the at least one inductor is arranged to be periodically switchably connected to the LC-resonant circuit in series with one said at least one inductor.

24. The voltage-controlled oscillator of claim 23, wherein:
the time-averaged effective inductance varies, depending on the control voltage according to the relationship of the duration of the conducting state and the duration of the non-conducting state of the switching means within an oscillation period of the voltage controlled oscillator.

25. The voltage-controlled oscillator of claim 23, wherein:
the at least one controllable switching device comprises switching transistors.

26. The voltage-controlled oscillator of claim 25, wherein:
the switching transistors are MOSFETs.

27. The voltage-controlled oscillator of claim 26, wherein:
the MOSFETs have gate terminals that are connected to the control input of the control voltage.

28. The voltage-controlled oscillator of claim 27, wherein:
the MOSFETs have source terminals that are connected to parts of a circuit arrangement carrying the oscillator frequency.

29. The voltage-controlled oscillator of claim 28, wherein:
the voltage controlled oscillator is of a CMOS or bipolar technology.

30. The voltage-controlled oscillator of claim 1, wherein:
the LC-resonant circuit has at least two first inductors; and
the at least one inductor is arranged to be periodically switchably connected to the LC-resonant circuit, in series with a first of the at least two first inductors and in parallel with a second of the at least two first inductors.

31. The voltage-controlled oscillator of claim 30, wherein:
the at least one controllable switching device comprises switching transistors.

32. The voltage-controlled oscillator of claim 31, wherein:
the switching transistors are MOSFETs.

33. The voltage-controlled oscillator of claim 32, wherein:
the MOSFETs have gate terminals that are connected to the control input of the control voltage.

34. The voltage-controlled oscillator of claim 33, wherein:
the MOSFETs have source terminals that are connected to parts of a circuit arrangement carrying the oscillator frequency.

35. The voltage-controlled oscillator of claim 34, wherein:
the voltage controlled oscillator is of a CMOS or bipolar technology.

* * * * *